(12) United States Patent
Sun et al.

(10) Patent No.: US 7,570,489 B1
(45) Date of Patent: Aug. 4, 2009

(54) HEAT DISSIPATION SYSTEM FOR DIGITAL ELECTRONIC SIGNBOARD

(75) Inventors: Kuo-Tsung Sun, Hsinchu (TW);
Jing-Lin Zhang, Hsinchu (TW);
Shen-Hsiung Chou, Hsinchu (TW);
Tsan-Chung Lee, Hsinchu (TW);
Hung-Pin Chen, Hsinchu (TW);
Hung-Yen Chiu, Hsinchu (TW);
Ding-Hua Ting, Hsinchu (TW)

(73) Assignee: Wincomm Corporation, Hsinchu (TW)

( * ) Notice: Subject to any disclaimer, the term of this patent is extended or adjusted under 35 U.S.C. 154(b) by 30 days.

(21) Appl. No.: 12/017,268

(22) Filed: Jan. 21, 2008

(51) Int. Cl.
*H05K 7/20* (2006.01)

(52) U.S. Cl. .................. 361/695; 361/690; 361/692; 313/46; 313/58; 345/84; 345/87

(58) Field of Classification Search ............ 361/681, 361/687, 679.47–52, 690–697, 808, 809, 361/831; 174/15.1, 16.3, 252, 260; 313/11–13, 313/17, 22, 35, 46, 44, 27, 58; 165/80.2, 165/80.3, 122, 126, 104.33, 104.32, 104.34, 165/185; 362/294, 373, 31; 345/10, 84, 345/87; 40/564, 570–576; 403/339, 354, 403/375; 349/60–65, 58, 161, 20, 12
See application file for complete search history.

(56) References Cited

U.S. PATENT DOCUMENTS

| | | | | |
|---|---|---|---|---|
| 5,497,573 A * | 3/1996 | Stadjuhar et al. | ............... | 40/564 |
| 5,991,153 A * | 11/1999 | Heady et al. | ................. | 361/704 |
| 6,154,362 A * | 11/2000 | Takahashi et al. | ........... | 361/695 |
| 6,476,883 B1 * | 11/2002 | Salimes et al. | ................ | 349/58 |
| 7,064,954 B1 * | 6/2006 | Wu et al. | ..................... | 361/695 |
| 2004/0000390 A1 * | 1/2004 | Stadjuhar et al. | ........... | 165/80.2 |
| 2006/0262501 A1 * | 11/2006 | Huang | ......................... | 361/694 |
| 2007/0267174 A1 * | 11/2007 | Kim | .......................... | 165/80.3 |

* cited by examiner

*Primary Examiner*—Michael V Datskovskiy
(74) *Attorney, Agent, or Firm*—Schmeiser, Olsen & Watts LLP

(57) ABSTRACT

A heat dissipation system for digital electronic signboard includes a first heat dissipation subsystem disposed in a main circuit board area of a digital electronic signboard, and a second heat dissipation subsystem disposed in a computer mainboard area of the digital electronic signboard. The main circuit board area has a plurality of heat dissipation fans disposed therein, wherein one heat dissipation fan is disposed at a side of the main circuit board area, while another heat dissipation fan is disposed at a side of a power supply and can be externally connected to an air guide pipe. The computer mainboard area can also have a plurality of heat dissipation fans disposed therein, wherein one heat dissipation fan is disposed at a side of the computer mainboard, while another heat dissipation fan is disposed on the top of a microprocessor of the computer mainboard.

4 Claims, 4 Drawing Sheets

HEAT DISSIPATION SYSTEM FOR DIGITAL ELECTRONIC SIGNBOARD

BACKGROUND OF THE INVENTION

1. Field of the Invention

The present invention relates to a heat dissipation system for a digital electronic signboard, and more particularly, to a heat dissipation system for dissipating heat for a circuit board in a digital electronic signboard.

2. Description of the Prior Art

As digital electronic signboard products provide more capabilities, higher frequencies, higher speed and smaller form factors, and chip sizes are shrinking at the same time. More heat is generated per unit area by electronic components; therefore, heat dissipation issues become more important. Additionally, because general electronic signboards are bulky and tend to rise to high temperature in operation, it is common that the electronic signboards could malfunction if the heat generated is not well dissipated. Therefore, it is necessary to provide a cost saving and efficient heat dissipation mechanism to dissipate heat from the electronic signboards.

Therefore, the traditional heat dissipation system for a electronic signboard presents several shortcomings to be overcome.

In order to overcome the above-described deficiencies of the traditional heat dissipation system for a electronic signboard, after years of constant effort in research, the inventor of this invention has consequently developed and proposed a new heat dissipation system for a digital electronic signboard in the present invention.

SUMMARY OF THE INVENTION

An aspect of the present invention is to provide a heat dissipation system for a digital electronic signboard. The heat dissipation system can quickly dissipate the heat generated by a main circuit board and a computer mainboard of the digital electronic signboard to lower the high temperature inside the digital electronic signboard.

Another aspect of the present invention is to provide a heat dissipation system for the digital electronic signboard. The heat dissipation system is simple to construct, easy to install, and cheap to manufacture and implement.

The present invention discloses a heat dissipation system for the digital electronic signboard having a first heat dissipation subsystem and a second heat dissipation subsystem. The first heat dissipation subsystem is disposed in a main circuit board area of a digital electronic signboard, and the second heat dissipation subsystem is disposed in a computer mainboard area of the digital electronic signboard. The main circuit board area has at least two heat dissipation fans disposed therein, wherein one heat dissipation fan is disposed at a side of the main circuit board area, while another heat dissipation fan is disposed at a side of a power supply. The heat dissipation fan disposed at the side of the power supply can be externally connected to an air guide pipe. The computer mainboard area has at least two heat dissipation fans disposed therein, wherein one heat dissipation fan is disposed at a side of the computer mainboard, while another heat dissipation fan is disposed on the top of a microprocessor of the computer mainboard. The heat dissipation system for the digital electronic signboard is thus formed by the above mentioned heat dissipation fans to quickly dissipate the heat generated therein to lower the temperature inside the digital electronic signboard to avoid malfunction of the digital electronic signboard.

These features and advantages of the present invention will be fully understood and appreciated from the following detailed description of the accompanying drawings.

DETAILED DESCRIPTION OF THE PREFERRED EMBODIMENT

Figure 1A:
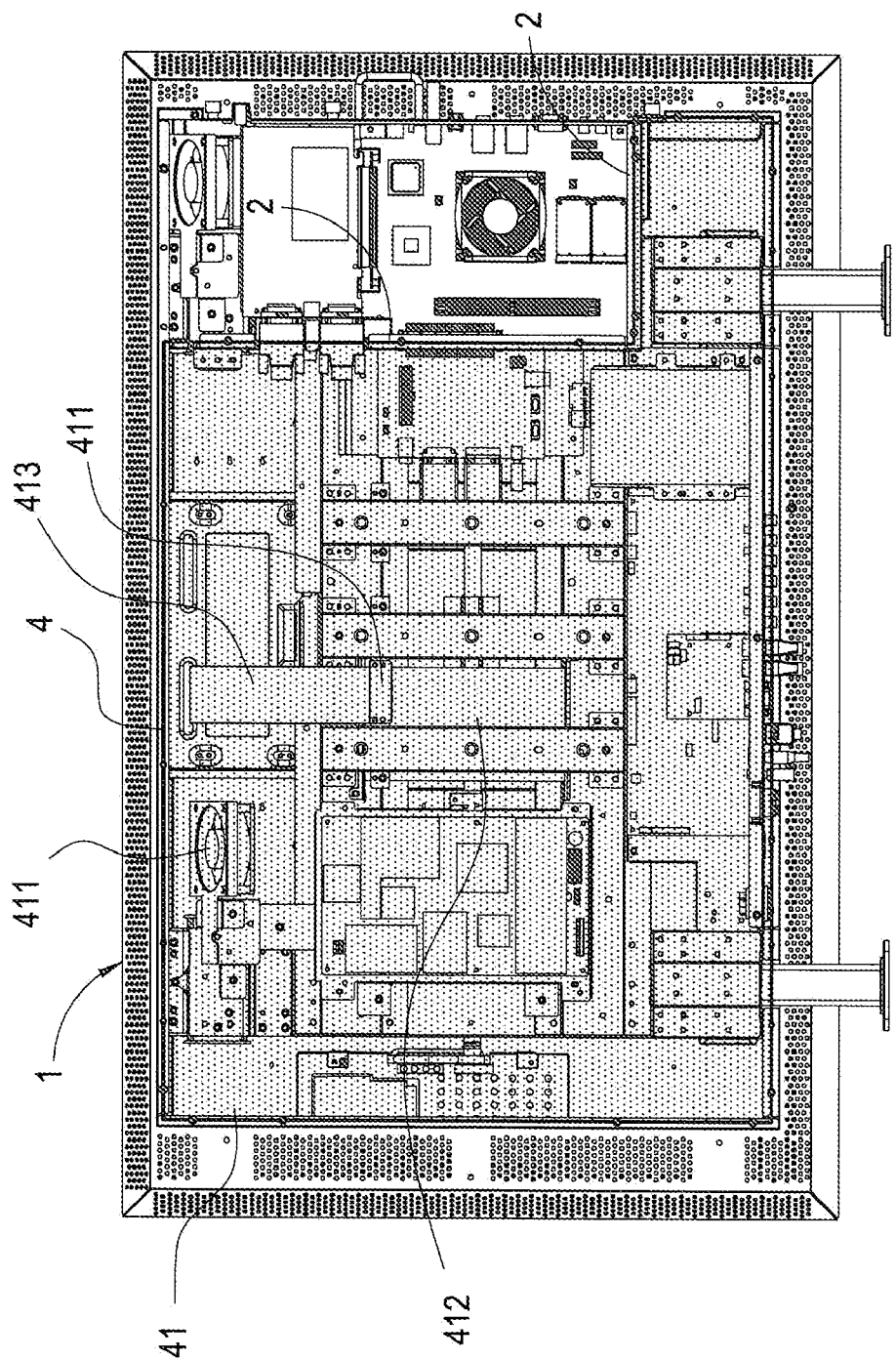
FIG. 1A and FIG. 1B illustrate back views of two subsystems for a heat dissipation system for a digital electronic signboard in the present invention.
Figure 1B:
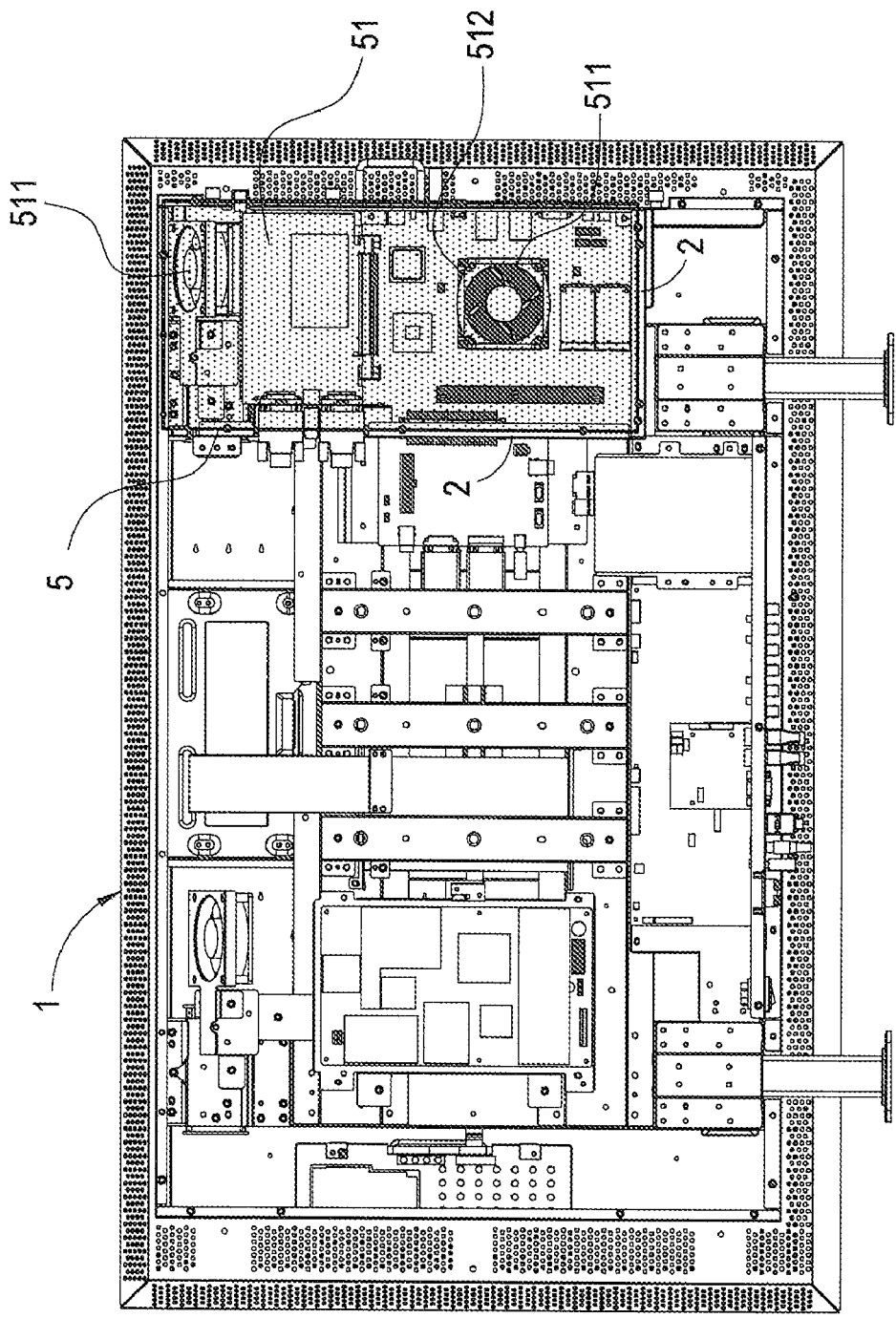
Figure 2:
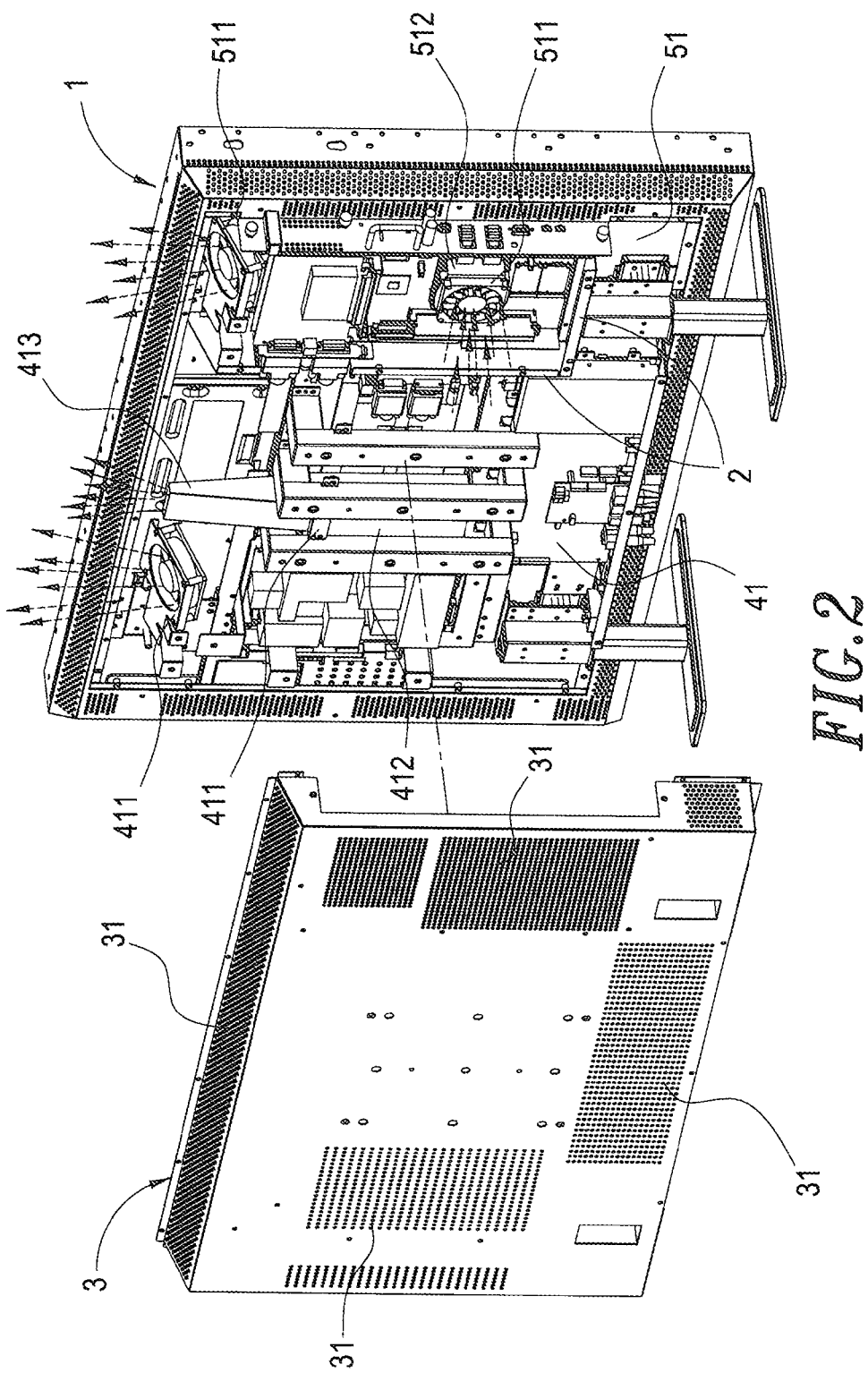
FIG. 2 illustrates a perspective exploded view of heat dissipation fans of the heat dissipation system for a digital electronic signboard disposed with respect to heat dissipation holes of a back cover.
Figure 3:
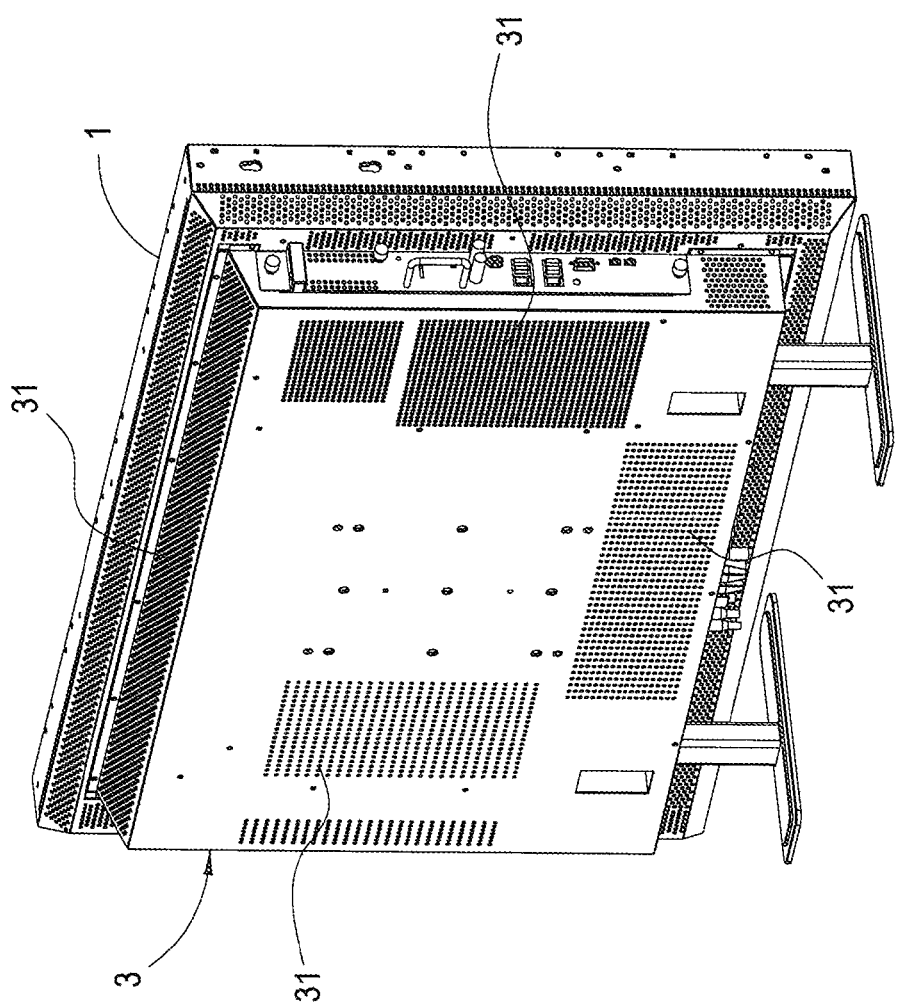
FIG. 3 illustrates a perspective view of the heat dissipation system for a digital electronic signboard.

Please refer to FIG. 1 through FIG. 3 for views of a heat dissipation system for digital electronic signboard, which comprises a digital electronic signboard, first heat dissipation system, second heat dissipation system, and a back cover.

The digital electronic signboard 1 comprises a first heat dissipation subsystem 4 and a second heat dissipation subsystem 5. The two heat dissipation subsystems 4 and 5 are separated by a partition board 2 into two dissipation areas (as shown by shaded areas in FIG. 1A and FIG. 1B). Finally, a back cover 3 is employed to cover the two heat dissipation subsystems 4 and 5.

Referring to FIG. 1A, the first heat dissipation subsystem 4 is disposed in the main circuit board area 41 of the digital electronic signboard 1. The main circuit board area 41 comprises at least two heat dissipation fans 411. One heat dissipation fan 411 is appropriately disposed at a side of the main circuit board area 41 for dissipating heat generated by the main circuit board area 41. Another heat dissipation fan 411 is disposed at a side of a power supply 412, and the heat dissipation fan 411 disposed at the side of the power supply 412 can be externally connected to an air guide pipe 413 for dissipating heat generated by the power supply 412. The implementation of the heat dissipation fan 411 is able to lower the high temperature of the main circuit board area 41.

Referring to FIG. 1B, the second heat dissipation subsystem 5 is disposed in the computer mainboard area 51 of the digital electronic signboard 1. The computer mainboard area 51 comprises at least two heat dissipation fans 511, wherein one heat dissipation fan 511 is appropriately disposed at a side of the computer mainboard area 51 for dissipating heat generated by the computer mainboard area 51, while another heat dissipation fan 511 is disposed at the top of a microprocessor 512 of the computer mainboard area 51 for dissipating heat generated by the microprocessor 512, the implementation of the heat dissipation fan 511 is able to lower the high temperature of the computer mainboard area 51.

Referring to FIG. 2, the back cover 3 comprises multiple rows of heat dissipation holes 31 disposed thereon. Some of heat dissipation holes 31 on the back cover 3 are disposed with respect to places where the heat dissipation fans 411, 511 of the heat dissipation subsystems 4, 5 and the air guide pipe 513 exhaust air.

The heat dissipation system of the digital electronic signboard 1 is thus formed by the above-mentioned components, as shown in FIG. 3. The two heat dissipation subsystems 4 and 5 inside the digital electronic signboard 1 can quickly dissipate heat through the heat dissipation holes 31 to the outside of the digital electronic signboard 1 to maintain the digital electronic signboard 1 in the most stable operation condition.

Comparing to conventional techniques, the present invention discloses a heat dissipation system for digital electronic signboard and has advantages as follows:

1. The present invention provides a heat dissipation system for a digital electronic signboard. The heat dissipation system can quickly dissipate the heat generated by a main circuit board and a computer mainboard of the digital electronic signboard to lower the high temperature inside the digital electronic signboard.

2. The present invention provides a heat dissipation system for the digital electronic signboard, which is simple to construct, easy to install, and cheap to manufacture and implement.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A heat dissipation system for a digital electronic signboard having a first heat dissipation subsystem and a second heat dissipation subsystem, comprising:

the first heat dissipation subsystem being disposed in a main circuit board area of a digital electronic signboard, the main circuit board area having at least two heat dissipation fans disposed therein, wherein one heat dissipation fan is appropriately disposed at a side of the main circuit board area, while another heat dissipation fan is disposed at a side of a power supply, and the heat dissipation fan disposed at the side of the power supply can be externally connected to an air guide pipe;

the second heat dissipation subsystem being disposed in a computer mainboard area of the digital electronic signboard; the computer mainboard area having at least two heat dissipation fans disposed therein, wherein one heat dissipation fans is appropriately disposed at a side of the computer mainboard, while another heat dissipation fan is disposed on the top of a microprocessor of the computer mainboard, the heat dissipation system for the digital electronic signboard is thus formed by the above mentioned heat dissipation subsystems.

2. The heat dissipation system for the digital electronic signboard of claim 1, wherein the first heat dissipation subsystem and the second heat dissipation subsystem are separated by a partition board.

3. The heat dissipation system for the digital electronic signboard of claim 1, wherein the first heat dissipation subsystem and the second heat dissipation subsystem are covered by a back cover, and the back cover comprises multiple rows of heat dissipation holes disposed thereon.

4. The heat dissipation system for the digital electronic signboard of claim 3, wherein some of the rows of heat dissipation holes on the back cover are disposed with respect to places where the heat dissipation subsystems and the air guide pipe exhaust air.

* * * * *